United States Patent [19]

Kameyama et al.

[11] Patent Number: 4,615,103

[45] Date of Patent: Oct. 7, 1986

[54] METHOD OF FORMING ISOLATION REGIONS CONTAINING CONDUCTIVE PATTERNS THEREIN

[75] Inventors: Shuichi Kameyama; Satoshi Shinozaki, both of Yokohama; Hiroshi Iwai, Tokyo, all of Japan

[73] Assignee: Tokyo Shibaura Denki Kabushiki Kaisha, Kawasaki, Japan

[21] Appl. No.: 737,922

[22] Filed: May 28, 1985

Related U.S. Application Data

[62] Division of Ser. No. 410,083, Aug. 19, 1982, Pat. No. 4,532,701.

[30] Foreign Application Priority Data

Aug. 21, 1981 [JP] Japan ................................. 56-131018
Dec. 25, 1981 [JP] Japan ................................. 56-212459

[51] Int. Cl.[4] ...................... H01L 21/76; H01L 21/88
[52] U.S. Cl. .................................... 29/576 W; 29/578; 29/580; 148/174; 148/DIG. 20; 148/DIG. 50; 148/DIG. 85; 156/643; 156/648; 156/653; 156/657; 156/659.1; 156/661.1; 357/50; 357/65

[58] Field of Search ....... 148/174, DIG. 50, DIG. 85, 148/DIG. 20; 29/765 W, 578, 580; 156/643, 648, 653, 657, 659.1, 661.1; 357/49, 50

[56] References Cited

U.S. PATENT DOCUMENTS

| | | | |
|---|---|---|---|
| 4,104,090 | 8/1978 | Pogge | 29/576 W |
| 4,238,278 | 12/1980 | Antipov | 156/657 |
| 4,394,196 | 7/1983 | Iwai | 156/648 X |
| 4,404,735 | 9/1983 | Sakurai | 29/576 W |
| 4,419,813 | 12/1983 | Iwai | 29/580 X |

Primary Examiner—William G. Saba
Attorney, Agent, or Firm—Finnegan, Henderson Farabow, Garrett & Dunner

[57] ABSTRACT

A method of manufacturing a semiconductor device which comprises a step of forming a first groove in a semiconductor layer, a step of filling the first groove with a first insulating film, a step of selectively etching the first insulating film in the first groove to form at least one second groove having a small width, and a step of filling the second groove with a second insulating film to form an isolation layer having a large width and substantially flush with the semiconductor layer.

5 Claims, 45 Drawing Figures

METHOD OF FORMING ISOLATION REGIONS CONTAINING CONDUCTIVE PATTERNS THEREIN

BACKGROUND OF THE INVENTION

This invention relates to a method of manufacturing a semiconductor device and, more particularly, to improvements in isolation techniques in the manufacture of bipolar type or MOS type ICs and LSIs.

In the manufacture of a semiconductor device, particularly a bipolar IC, the isolation of elements is usually realized by a p-n junction and an oxide film formed by a selective oxidation process. This process will now be described in connection with the manufacture of a bipolar vertical npn transistor.

First, in a p-type silicon substrate 1 an n-type buried region 2 of high impurity concentration is selectively formed as shown in FIG. 1A. An n-type semiconductor layer 3 is then epitaxially grown. A silicon oxide film 4 is then formed to a thickness of approximately 1,000 Å, and then an oxidation-resistive silicon nitride film 5 is deposited to a thickness of approximately 1,000 Å. The silicon oxide film 4 and silicon nitride film 5 are then patterned using the photoetching technology to form a silicon oxide film pattern 4a, 4b and a silicon nitride film pattern 5a, 5b as shown in FIG. 1B. The n-type semiconductor layer 3 is then selectively etched to a depth of approximately 5,000 Å using the silicon oxide film pattern 4a, 4b and silicon nitride film pattern 5a, 5b as a mask. Then, boron is ion implanted using the patterns 4a, 4b and 5a, 5b as a mask to form p-type regions 6a and 6b as shown in FIG. 1C. Subsequently, a silicon oxide film 7a to 7c is selectively grown to a thickness of approximately 1 μm through thermal oxidation carried out in steam or like wet atmosphere, as shown in FIG. 1D. The silicon nitride film pattern 5a, 5b is then removed, for instance using hot phosphoric acid, and a base region 8 is formed in that portion of the semiconductor layer 3 which has been under the silicon nitride film pattern 5a. Further, an n-type region 9 to serve as an emitter and an n-type region 10 to serve as a collector are formed by ion implantation of arsenic. A contact window is further formed in the silicon oxide film 4a. Then, an emitter electrode 12, a base electrode 11 and a collector electrode 13 are formed to obtain a vertical npn transistor as shown in FIG. 1E. In this case, the isolation of the npn transistor is realized by the combination of the oxide film portions 7a and 7c with the thickness of approximately 1 μm and p-type regions 6a and 6b. If the thickness of the n-type semiconductor layer 3 is of the order of 1 to 2 μm, the isolation can be obtained with the oxide film only by forming the oxide film to be contiguous to the p-type substrate 1. Also, even in this case, it is desirable to form channel stop regions between the p-type substrate and oxide film by ion implanting a p-type impurity.

The method of manufacturing a bipolar IC using a selective oxidation process as described above, however, has various drawbacks as described in the following.

FIG. 2 shows a detailed sectional structure that is obtained when the field oxide film 7a, 7b is formed using the Si3N4 film pattern 5a, 5b as a mask. Here, no process of etching the silicon layer 3 has been carried out. It is well known in the art that in a selective oxidation process an oxide film "wedges into" a region underneath Si3N4 film pattern (as shown at F in FIG. 2). This portion of the oxide film 7b consists of a commonly termed bird's beak D, which is formed as the oxidizing agent and is diffused through the thin SiO2 film 4a under the Si3N4 pattern 5a and a portion E which is formed as the thick portion of the oxide film 7b extends laterally. When the oxide film 7b is grown to a thickness of 1 μm with the Si3N4 film 5a formed to have a thickness of 1,000 Å and the SiO2 film 4a under the film 5a formed to have a thickness of 1,000 Å, the lateral dimension of the portion F increases to approximately 1 μm. Therefore, if the distance A between the Si3N4 pattern portions 5a and 5b is 2 μm, the isolation region C inevitably has a width of at least 4 μm because the portion F has a width of 1 μm. This is a serious restriction on the integration density of an LSI. There have been attempts to suppress the bird's beak (i.e., portion D) by increasing the thickness of the Si3N4 film pattern 5a, 5b while reducing the thickness of the SiO2 film and also to suppress the "wedging" portion F by reducing the thickness of growth of the oxide film 7b. However, in the former case an excessive stress results at the wedging portion of the isolation region. In this case, generation of defects is prone. In the latter case, the field inversion voltage is reduced. In addition, the wiring capacitance in the isolation region is increased. In either case, the selective oxidation process imposes restrictions on the integration density.

The problems that arise due to formation of the bird's beak will now be discussed in connection with a prior art method of manufacturing a bipolar transistor using a selective oxidation process as shown in FIGS. 3A and 3B.

In the illustrated method, a SiO2 film 22, 22b is formed by the conventional selective oxidation process on a semiconductor layer 21 which is also an n-type collector region as shown in FIG. 3A. With this oxide film as a mask, boron is ion implanted to form a p-type base region 23. Subsequently, an n-type emitter region 25 is formed by a diffusion process or an ion implantation process as shown in FIG. 3B. A SiO2 film 24 is formed as an insulating film for insulating the base and emitter electrodes from each other.

Problems in this method of manufacturing the bipolar transistor using the selective oxidation process reside mainly in the shape of the bird's beak of the SiO2 film 22a, 22b and the stress in the semiconductor region in the neighborhood of the bird's beak as well as resultant generation of defects. The depth D of the base junction right beneath the bird's beak is less than the depth C of the base junction right beneath the principal surface of the semiconductor substrate by the thickness of the oxide film of the bird's beak. The value of the depth D is further reduced since the surface of the silicon oxide film is etched in the etching process during manufacture. If an aluminum electrode is formed as a base electrode, therefore, the aluminum is liable to penetrate the base region due to reaction between aluminum and silicon. This would result in a defective element. In addition to the smaller depth of the base junction right beneath the bird's beak, the end of the bird's beak recedes in the etching process in manufacture. Therefore, the depth of the emitter junction beneath the bird's beak becomes greater than that beneath the other portions. Further, due to defects caused by stress produced in the selective oxidation process, abnormal diffusion takes place in the emitter region increasing the depth of the emitter junction. Therefore, the depth dimension B of the base right beneath the bird's beak becomes less than the normal base depth A. For the above reasons, defective collector-emitter breakdown voltage on the npn transistor becomes probable. This problem is encountered when the selective oxidation process is employed in the manufacture of a bipolar IC.

To overcome the above drawbacks, one of the inventors earlier proposed a method of manufacturing a bipolar semiconductor device (such as a vertical npn transistor), in which the isolation regions are formed in a novel process which will now be described with reference to FIGS. 4A to 4E.

First, in a p-type semiconductor substrate 101 a high-impurity concentration buried layer 102 doped with an n-type impurity is formed as shown in FIG. 4A. Atop the system an n-type epitaxial layer 103 is grown to a thickness of approximately 2.5 $\mu$m. A resist pattern 104a, 104b, 104c is then formed by a photoetching process on the semiconductor layer 103. The semiconductor layer 103 is then selectively etched by an anisotropic reactive ion etching process with the resist pattern 104a, 104b, 104c as the etching mask. Thus, grooves 105a and 105b with a width of approximately 1 $\mu$m and a depth of approximately 3 $\mu$m are formed to isolate an island region of the n-type semiconductor layer 103, as shown in FIG. 4B. At this time, it is desirable to form p-type channel stop regions 106a and 106b by ion implanting boron.

Subsequently, the resist pattern 104, 104b, 104c is removed, and then a SiO$_2$ film 107 is deposited by the CVD process to a thickness sufficiently greater than one half of the width of the isolating grooves 105a and 105b (which is approximately 5,000 Å). At this time, SiO$_2$ is gradually deposited on the surfaces of the grooves 105a and 105b to eventually fill the grooves. The SiO$_2$ film 107 thus formed has a substantially flat surface. During the deposition process, re-distribution of the impurity in the p-type regions 106a and 106b hardly occurs unlike in the selective oxidation process in which thermal oxidation is carried out at a high temperature and for a long time. The SiO$_2$ film 107 is then etched using ammonium fluoride until the semiconductor layer 103, other than the grooves 105a and 105b, is exposed. In this step, only the thickness of the SiO$_2$ film 107 atop the semiconductor layer 103 is removed to leave SiO$_2$ in the grooves 105a and 105b as shown in FIG. 4D. Thus, isolating layers 107a and 107b buried in the semiconductor layer 103 are formed.

Thereafter, a p-type base region 108 is formed by ion implanting boron in a resist block process in the semiconductor region isolated by the isolating regions 107a and 107b. An insulating film 109 is then formed to a thickness of approximately 3,000 Å on the entire wafer surface. Emitter and collector impurity diffusion windows are formed by using a photoetching process. Arsenic is then ion implanted through the windows to form an n-type regio 110 which serves as emitter and an n-type region 111 which serves as collector. The insulating film 109 is then formed with a window for the p-type base region 108. An electrode material such as Al is then deposited on the wafer surface and patterned by a photoetching process to form a base electrode 112, an emitter electrode 113 and a collector electrode 114, as shown in FIG. 4E. An npn bipolar transistor is obtained in this way.

The method described above has various effects as described in the following.

Firstly, since the area of the isolating regions is determined by the area of the grooves formed in the semiconductor layer, narrow isolating regions can be readily formed by reducing the area of grooves. Thus, it is possible to obtain a bipolar semiconductor device having an increased integration density.

Secondly, since the depth of the isolating regions is determined independently of their area but solely by the depth of grooves formed in the semiconductor layer, it can be selected to a desired value. In addition, current leaks among individual semiconductor elements can be reliably prevented by the isolation regions. Thus, it is possible to obtain a high-performance bipolar semiconductor device.

Thirdly, the method is free from a high temperature and long time thermal oxidation treatment as in the ordinary selective oxidation process. Thus, the channel stop region impurity that has been selectively doped through the grooves will never re-diffuse laterally to reach the buried layer or active transistor regions in the isolated transistor region. This has the effect of preventing the reduction of the isolated element region. If the impurity doping is done by ion implantation, an impurity ion implantation layer can be formed at the bottom of each groove. In this case, even if rediffusion of the impurity in the ion implantating layer is caused, the re-diffusion region will never develop to reach the surface layer in the isolated element region (i.e., active regions of transistor). Thus, it is possible to prevent deterioration of the impurity doped regions of the transistor as well as preventing the effective reduction of the isolated element region.

Fourthly, the isolating regions formed by leaving an insulating material in the entire grooves can be flush with the isolated element region. Thus, it is possible to eliminate disconnection of subsequently formed electrode at the boundary between the isolated element region and an isolating region.

While the above method has the various advantages described, it still is defficient when an isolating region having a large width is formed, though there is no problem when all the isolating regions have a small width. Since the width S of an isolating region is determined by the width S of the corresponding groove, in order to completely fill the groove with an insulating film, the thickness T of the insulating film must be set to be $T > \frac{1}{2}S$. If it is intended to form an isolating region having a large width, it is necessary to deposit an insulating film to a considerable thickness. For example, in order to form an isolating region having a width of 20 $\mu$m, it is necessary to deposit an insulating film to a thickness of at least 10 $\mu$m. In this case, many difficulties are encountered in connection with the deposition period, precision of the film thickness, conditions free from the generation of cracks and so forth. Furthermore, by the above method it is very difficult to form an isolating region having as large a width as 200 $\mu$m (such as the one under an aluminum bonding pad). If an isolating region having a large width is necessary, therefore, it is formed by a method as shown in FIG. 5. Here, after narrow isolating layers 107a, 107b and 107c have been formed in respective grooves, an insulating film (for instance a SiO$_2$ film) is deposited and selectively photoetched to form an isolating region 107' having a large width.

Although an isolating region having a large width can be formed by this method, the isolating region thus obtained is not flush with the isolated element region, that is, a difference in level is produced between the isolating region and the isolated element region. When using the selective oxidation process, one half of the isolating layer (field oxide layer) is buried in the semiconductor layer, but according to the method of FIG. 5 the entirety of the insulating film 107' constitutes the difference in level. In other words, FIG. 5, the difference in level is more than when using the selective oxidation process. This is a serious drawback when microlithography is required in the neighborhood of the wide isolating layer.

SUMMARY OF THE INVENTION

An object of the invention is to provide a method of manufacturing a semiconductor device, which permits formation of a self-aligned isolating region having a large width in a groove formed in a semiconductor layer such that the isolating region is flush with the surface of the semiconductor layer, and so that high integration density and high performance can be achieved.

Another object of the invention is to provide a method of manufacturing a semiconductor device, which permits formation of an isolating region having a large width and containing a buried interconnection electrode of a conductive material.

According to the invention, there is provided a method of manufacturing a semiconductor device, which comprises a step of forming a first groove having a large width in a semiconductor layer, a step of filling the first groove with a first insulating film, a step of forming a mask pattern on the first insulating film filling the first groove, a step of selectively etching the first insulating film in the first groove using the mask pattern as a mask to form at least one second groove having a small width, and a step of filling the second groove with a second insulating film to form an isolating layer having a large width.

According to the invention, there is also provided a method manufacturing a semiconductor device, which comprises a step of forming a first groove having a large width in a semiconductor layer, a step of forming, in the first groove, a first insulating film having a thickness smaller than the depth of the first groove, a step of filling the first groove other than the first insulating film with a conductive film, a step of selectively etching the conductive film in the first groove to form at least one second groove having a small width, and a step of filling the second groove with a second insulating film to form an isolating layer having a large width including the conductive film pattern surrounded by the first insulating film and second insulating film.

According to the invention, there is further provided a method of manufacturing a semiconductor device, which comprises a step of forming a first groove having a large width in a semiconductor layer, a step of filling the first groove with an insulating film, a step of forming at least one second groove in the first insulating film in the first groove, the second groove being shallower than the first groove and defined by an insulating material, and a step of filling the second groove with a conductive film to form an isolating layer having a large width including the conductive film surrounded by the insulating material.

DETAILED DESCRIPTION OF THE PREFERRED EMBODIMENTS

Figure 1A:
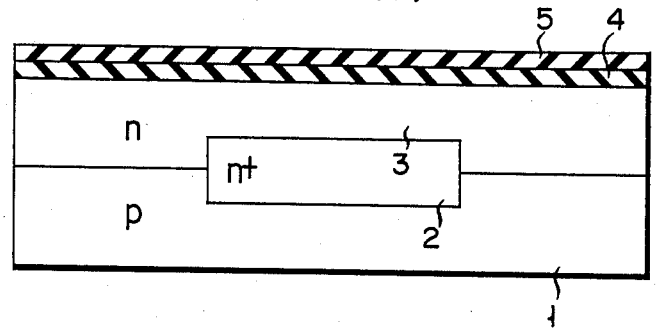
FIGS. 1A to 1E are sectional views illustrating a prior art method of manufacturing an npn bipolar transistor using the selective oxidation process.
Figure 1B:
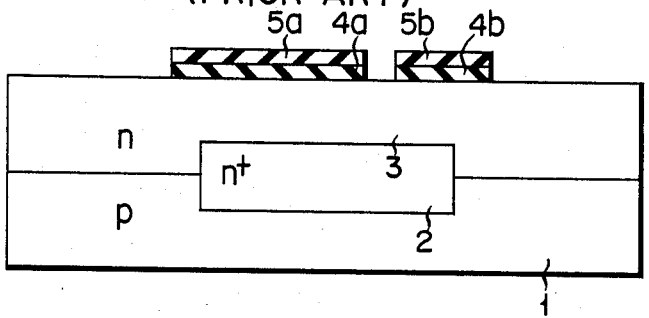
Figure 1C:
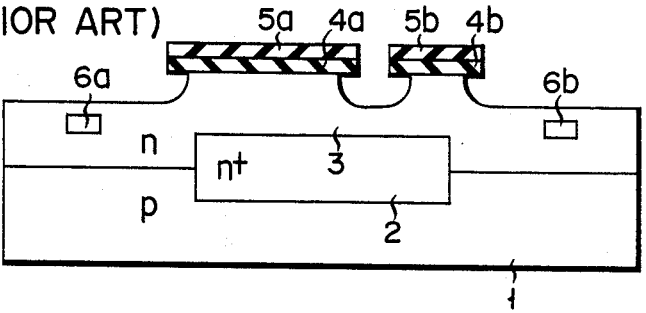
Figure 1D:
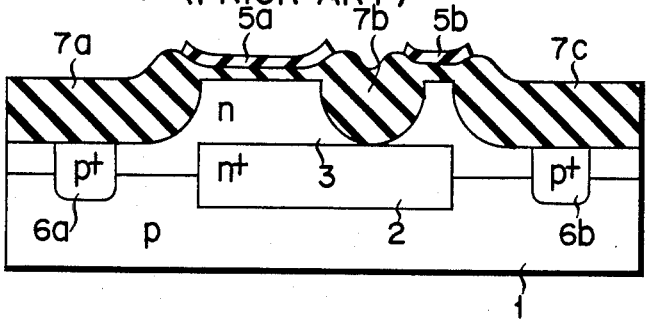
Figure 1E:
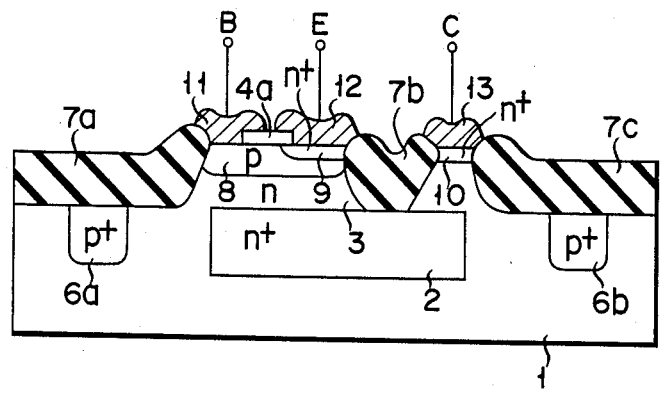
Figure 2:
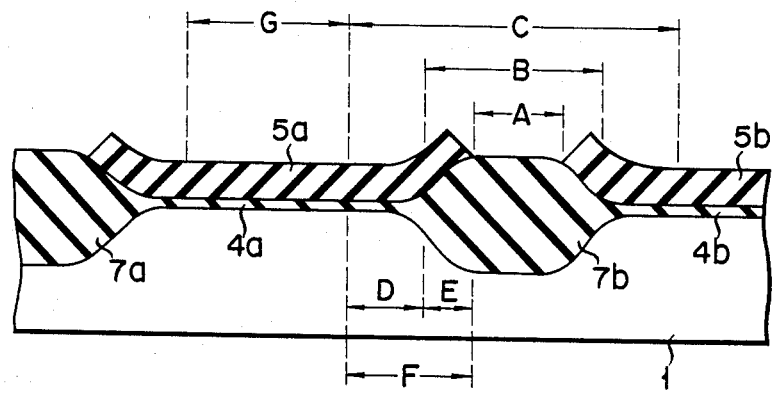
FIG. 2 is a sectional view for explaining problems inherent in the selective oxidation process.
Figure 3A:
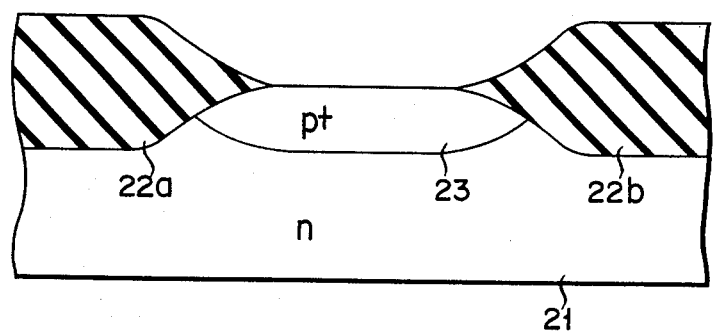
FIGS. 3A and 3B are sectional views illustrating a prior art method of manufacturing an npn bipolar transistor using the selective oxidation process.
Figure 3B:
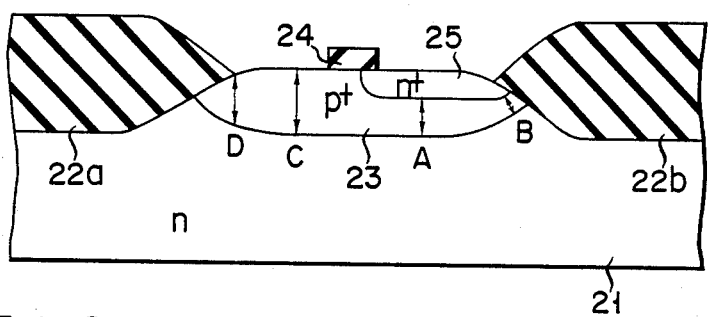
Figure 4A:
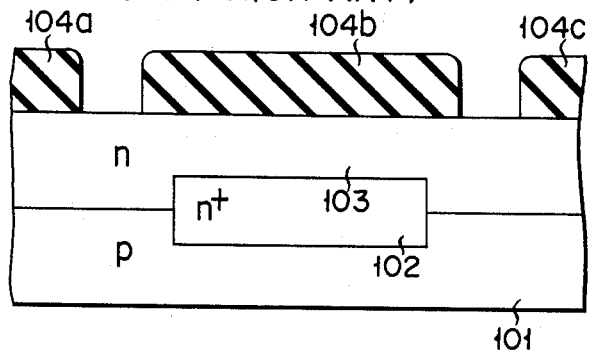
FIGS. 4A to 4E are sectional views illustrating a method of manufacturing an npn bipolar transistor using a different isolating region formation process.
Figure 4B:
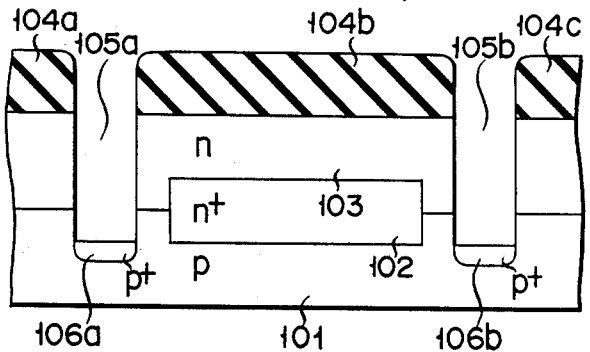
Figure 4C:
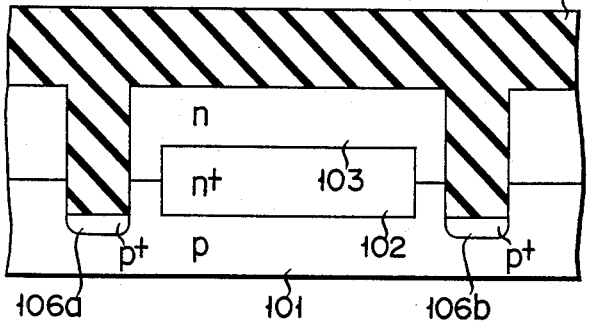
Figure 4D:
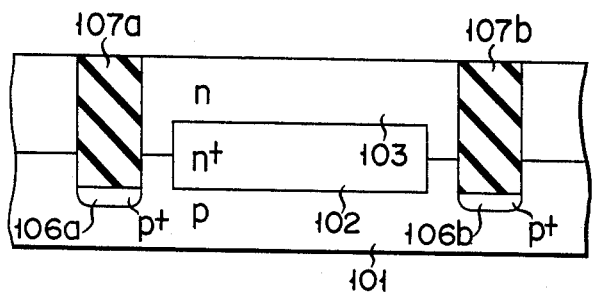
Figure 4E:
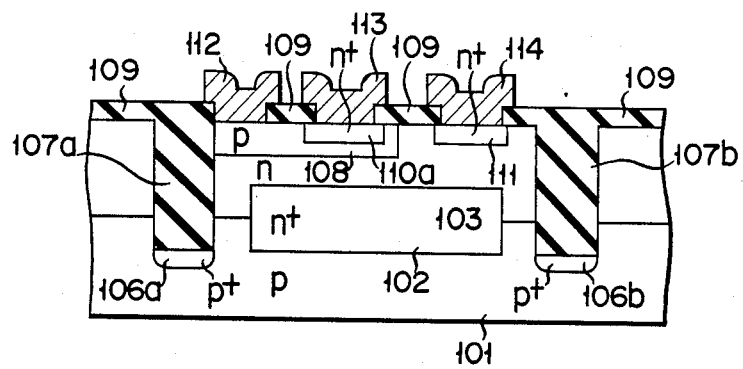
Figure 5:
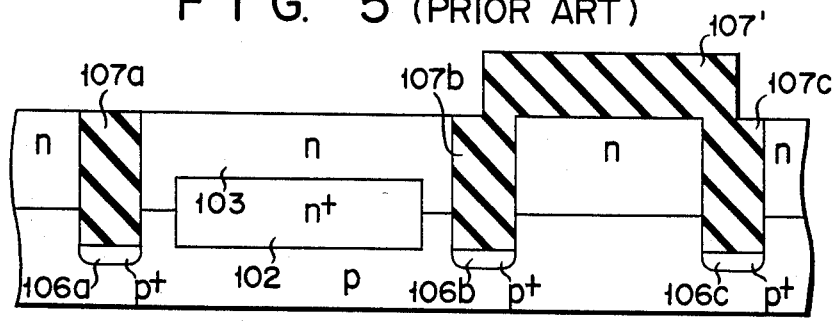
FIG. 5 is a sectional view showing a large width isolating region formed by a method similar to the method shown in FIGS. 4A to 4E.

Now, the invention will be described in detail.

The principles underlying the method according to the invention reside in forming a first groove having a large width in a semiconductor layer, filling the groove with a first isolating material film, forming a mask pattern on the first isolation material film, forming one or more second grooves having a small width in the first isolating material film in the first groove and filling the second grooves with a second isolating material film, thereby forming an isolating layer having a large width which is flush with the surface of the semiconductor layer.

According to the invention, there are two categories of methods. In one category, a large width isolating layer which consists solely of an insulating material is formed. In the other category, a large width isolating layer which consists of a conductive material surrounded by another insulating material is formed. The former category includes two varieties. In one variety (which is a first embodiment of the invention), the first isolating material film is formed by depositing an insulating film on the entire surface of the semiconductor layer inclusive of the surfaces of the first groove. In the other variety (which is a second embodiment of the invention), the first isolating material film is formed by carrying out selective thermal oxidation with respect to the surfaces of the first groove. The latter category includes two varieties (which are respective third and fourth embodiments of the invention) in which a conductive layer is formed in different steps in order.

The first embodiment of the invention will now be described.

On a semiconductor substrate of a first conductivity type a semiconductor layer of a second conductivity type is formed. A mask pattern, for instance a resist pattern, is then formed on the surface of the semiconductor layer other than portions thereof in which a groove having a large width and a groove having a small width are to be formed. The portions of the semiconductor layer not covered by the mask pattern are then selectively etched to a desired depth, thus forming the large and small width grooves. If the etching is carried out by reactive ion etching, the grooves that are formed may have substantially perpendicular side surfaces. However, grooves having tapered side surfaces may be formed by different etching means.

Subsequently, the mask pattern is removed, and a first insulating film is formed on the entire surface of the semiconductor layer inclusive of the surfaces of the grooves to a thickness equal to or substantially equal to the depth of the grooves. The first insulating film may be formed by depositing a first insulating material in the CVD or PVD process. Examples of the first insulating material are $SiO_2$, $Si_3N_4$, $Al_2O_3$ and undoped poly-silicon. Also, depending upon conditions, it is possible to use a low-melting insulating material such as phosphorus silicide glass (PSG), arsenic silicide glass (AsSG) and a boron silicide glass (BSG). Prior to the formation of the first insulating film, a channel stopper region or a pn junction region may be formed in a portion of the semiconductor constituting the bottom of each groove by selectively doping that portion with an impurity of the same conductivity type as the substrate. Also, prior to the deposition of the first insulating material an oxide or nitride film may be grown on the entire groove surfaces or part thereof through an oxidation or nitrification treatment to such an extent that the grooves are not filled up. In this case, the isolating layer that is eventually obtainable consists of an oxide or nitride film, contiguous to a semiconductor layer portion defining each groove or part thereof and having a superior density, and an insulating film formed by the deposition. This isolating layer may have a very superior isolating property to an isolating layer which consists solely of the deposited insulating material. Further, subsequent to the deposition of the first insulating material, a superficial layer of the deposited insulating film or part thereof may be doped with a low fusing material, for instance boron, phosphorus or arsenic, and the doped layer in the insulating film may be fused through thermal treatment. Alternatively, a low melting insulating material, for instance boron silicide glass (BSG), phosphorus silicide glass (PSG), arsenic silicide glass (AsSG) or resist, may be deposited on the entirety or part of the surface of the deposited insulating film, and the low melting insulating film thus deposited may be fused. If this is done, a depressed portion of the first insulating film that may result within the large width groove depending upon the conditions under which the first insulating material is deposited, may be filled up to provide for an eventual flat surface.

Afterwards, a mask pattern is formed on the surface of the portion of the first insulating film that fills the large width groove. This mask pattern is formed so that it is spaced apart from either side surface of the large width groove by a distance greater than the thickness of the first insulating film. With this mask pattern as an etching mask, the first insulating film is etched by anisotropic etching, for instance reactive ion etching, until the semiconductor layer is exposed. In this step, two second grooves having small widths are formed in the first insulating film in the large width grooves. Since the first insulating film is etched by anisotropic etching, portions of the first insulating film, contiguous to the side walls of the large width groove and having a width substantially equal to the thickness of the first insulating film, are left in the large width groove. Of course, a portion of the first insulating film under the mask pattern is left. The width of the second grooves is determined by the precision of the mask alignment and can be held within 1 to 2 $\mu$m.

A second insulating film is then formed on the entire surface inclusive of the surfaces of the second grooves to a thickness greater than one half the width of the second grooves. The second insulating film may be formed using the same material and by the same process as for the first insulating film. The second insulating film is then etched until the semiconductor layer is exposed, so that portions of the second insulating film are left in the second grooves.

An isolating layer which consists solely of the insulating material thus can be formed in the large width groove so that it is substantially flush with the surface of the semiconductor layer. As for the first groove of small width, it can be filled if the sum of the thickness of the first insulating film and the thickness of the second insulating film is at least one half the width of the first groove of small width. An insulating layer that is formed to fill this first groove of small width may also be used as an isolating layer for a bipolar transistor, a MOS, etc.

A gist of the first embodiment resides in leaving, in a large width groove formed in a semiconductor layer and having perpendicular or substantially perpendicular side surfaces, an insulating film pattern having a thickness substantially equal to the depth of the groove and having perpendicular or substantially perpendicular side surfaces so that the insulating film pattern is spaced apart at certain distances from the opposed side surfaces of the second grooves, subsequently depositing an insulating film to a thickness greater than one half the width of second grooves when the insulating film pattern has been left, and etching the deposited insulating film until the semiconductor layer surface is exposed, thus filling the second grooves. For leaving the insulating film pattern having perpendicular or substantially perpendicular side surfaces in the large width groove, various processes such as direct patterning process and lift-off process may be adopted.

According to the first embodiment described above, it is thus possible to form an isolating layer having a desired large width and flush with an isolated semiconductor region as well as the useful effect obtainable according to the prior art method discussed earlier. Thus, a semiconductor device such as a bipolar transistor device, which has high integration density, high performance and high reliability, can be obtained.

The second embodiment will now be described.

A mask material film is formed on a semiconductor layer such as a silicon layer, and its portion corresponding to a large width groove to be formed is then photoetched to form a mask pattern. Examples of the mask material film are a silicon nitride film and a two-layer lamination consisting of a silicon oxide film and a silicon nitride film. Using this mask pattern the semiconductor layer is selectively etched to a desired depth to form a first groove. In this process, a groove having perpendicular or substantially perpendicular side surfaces can be obtained by means of anisotropic etching such as reactive ion etching. However, grooves having tapered side surfaces may be formed by different etching means. Such a groove can be filled with a first insulating film to be described later, which has a desirous shape.

Subsequently, a thermal oxidation treatment on the system is carried out using the mask pattern which may consist of a silicon nitride film as an oxidation-resistive mask. Thus, the first insulating film which consists of an oxide is selectively formed in the exposed first groove. If a two-layer lamination consisting of a thin silicon oxide film and a thin silicon nitride film is used as the oxidation-resistive mask, it is possible to alleviate stress produced in portions of the semiconductor layer corresponding to the edges of the mask pattern during the thermal oxidation process. Also in this process, the first insulating film may be made substantially flush with the surface of the semiconductor layer by suitably selecting the depth of the groove and the thickness of the first insulating film.

The mask pattern is then removed, and then second grooves having small widths are formed in a portion of the semiconductor layer and also boundary portions between the semiconductor layer and the first insulating film. In this process, grooves having perpendicular or substantially perpendicular side surfaces can be obtained as the second grooves by using an anisotropic etching process such as reactive ion etching. By so doing, the precision of pattern alignment can be increased in obtaining a large width isolating layer by filling the second grooves with a second insulating film.

The small width second grooves are then filled with a second insulating film. This can be accomplished by either one of the following two methods.

In the first method, the second insulating film is deposited on the semiconductor wafer having the second grooves filled by the CVD or PVD process to a thickness sufficiently greater than one half the width of the grooves. Then, the second insulating film is etched until the semiconductor layer surface is exposed, thus leaving portions of the second insulating film in the second grooves.

Examples of the second insulating material are $SiO_2$, $Si_3N_4$, $Al_2O_3$ and undoped poly-silicon. In some cases, a low melting insulating material such as phosphorus silicide glass (PSG), arsenic silicide glass (AsSG) or boron silicide glass (BSG) may be used. Prior to the formation of the second insulating film, a channel stopper region or a pn junction region may be formed in a portion of the semiconductor layer or semiconductor substrate constituting the bottom of the second groove by selectively doping that portion with an impurity of the same conductivity as the substrate. Also, prior to the deposition of the second insulating material an oxide or nitride film may be grown on the entire groove surfaces or part thereof, through an oxidation or nitrification treatment, to such an extent that the grooves are not filled up. In this case, the isolating layer that is eventually obtainable consists of an oxide or nitride, contiguous to a semiconductor layer portion defining each groove or part thereof and having a superior density, and an insulating film formed by the deposition. This isolating layer may have a very superior isolating property to an isolating layer which consists solely of the deposited insulating material. Further, a superficial layer of the deposited insulating film or part thereof may be doped with a low fusing material, for instance boron, phosphorus or arsenic, and the doped layer in the insulating film may be fused through a thermal treatment. Alternatively, a low melting insulating material, for instance boron silicide glass (BSG), phosphorus silicide glass (PSG), arsenic silicide glass (AsSG) or resist, may be deposited on the entirety or part of the surface of the deposited insulating film, and the low melting insulating film thus deposited may be fused. If this is done, a depressed portion of the first insulating film that may result within the large width groove depending upon the conditions under which the first insulating material is deposited, may be filled up to provide for an eventual flat surface.

In the second method, a material which can be converted into an oxide through oxidation is deposited by the CVD or PVD process on the semiconductor wafer surface having the second grooves and is etched until the semiconductor layer surface is exposed, thus leaving the material in the grooves. A thermal treatment on the system is then carried out to convert the remaining material into the oxide, i.e., the second insulating film. Examples of the material for conversion into the oxide are polycrystalline silicon and non-crystalline silicon. Prior to the deposition of the initial material, a thin oxide or nitride film may be grown at least in the second grooves through oxidation or nitrification to such an extent that the grooves are not filled up. In this case, the initial material left in the grooves need not be entirely oxidized, but only a superifical portion of the material may be oxidized to form the second insulating film containing unoxidized initial material.

A large width isolating layer is constituted by the first insulating film formed in the large width groove and the second insulating film also formed in the groove by either one of the above methods and integral with the first insulating film. A semiconductor device such as a bipolar element or a MOS element may be formed in the island portion of the semiconductor layer isolated by the small and large width isolating layers thus formed.

A gist of the second embodiment resides in forming a first groove having a large width and having perpendicular or tapered side surfaces in a semiconductor layer, forming in the groove a first insulating film having a thickness substantially equal to the depth of the groove through thermal oxidation or the like, providing second grooves in portions including the first insulating film and a semiconductor layer in the neighborhood of the side surfaces of the first groove, and filling the second grooves with a second insulating material, thereby obtaining an isolating layer having a large width. According to the second embodiment of the invention it is thus possible to form an isolating layer having a desired large width and flush with an isolated semiconductor region as well as having the useful effects obtainable according to the prior art method discussed earlier. Thus, a semiconductor device such as a bipolar transistor and a MOS transistor with high integration density, high performance and high reliability, can be obtained.

The third embodiment of the invention will now be described.

Like the second embodiment described before, a semiconductor layer is selectively etched to a desired depth using a mask pattern, thus forming a first groove having a large width (or a small width if necessary). For the mask material, a resist material and $SiO_2$ may be used as well as an oxidation-resisting material.

The mask pattern is then removed, and a first insulating film is formed at least in the first groove. The first insulating film has a thickness sufficiently less than the depth of the groove. Examples of the first insulating film are $SiO_2$ and $Si_3N_4$ films deposited by the CVD or PVD process, a lamination of these films and a thermal oxide or Si$_3$N$_4$ film formed by thermal oxidation or nitrification.

A conductive film is then deposited on the entire wafer surface inclusive of the surfaces of the first groove. The conductive film is deposited to a thickness so that it fills the first groove, in which the first insulating film has been formed, and so that its surface in the groove is substantially flush with the semiconductor layer surface. Examples of the conductive material are polycrystalline silicon doped with such impurities as phosphorus, arsenic and boron, amorphous silicon doped with the same impurity, a metal silicide such as tungsten silicide and molybdenum silicide or a metal such as aluminum, molybdenum, titanium and tantalum. In some case, a non-doped polycrystalline or amorphous silicon film may be deposited, and after a subsequent patterning step, to be described later, it may be doped with an impurity to obtain a conductive film pattern.

A mask pattern consisting of stripes on a mask material is then formed on the principal surface of at least the conductive film portion in the large width groove. Examples of the mask material used here are a resist, SiO$_2$ and Si$_3$N$_4$. Using this mask pattern, the conductive film is etched by means of anisotropic etching such as reactive ion etching, thus obtaining a conductive film pattern consisting of stripes of the conductive film serving as a lead pattern. If the conductive film is also formed in a groove having a small width formed in a separate portion of the semiconductor layer having a thickness sufficiently greater than one half of the width of that groove, a portion of the conductive film is also left in the small width groove.

Subsequently, the second grooves defined by the conductive film pattern are filled with a second insulating film. This can be accomplished by depositing an insulating material to sufficiently fill the second grooves and etching the deposited insulating material other than positions thereof in the second grooves. When the conductive film pattern has been formed from impurity-doped polycrystalline silicon, impurity-doped amorphous silicon or metal silicide, it is possible to adopt an alternative process of filling the second grooves defined by the conductive film pattern with the second insulating film, in which an oxide film is grown directly on the side surfaces of the conductive film pattern by carrying out a thermal treatment.

With the second insulating material left in the second grooves defined by the conductive film pattern, an isolating layer having a large width can be obtained, which includes conductive film pattern in the form of stripes (which can serve as interconnection electrodes) surrounded by the thin first insulating film and the second insulating material, and which is substantially flush with the semiconductor layer surfaces. A semiconductor device such as a bipolar element or a MOS element may be formed in the island portion of the semiconductor layer isolated by the large width isolating layer, and the small width isolating layer if necessary.

According to the third embodiment, an isolating layer having a large width, which is flush with an isolated element region and includes a buried lead pattern, can be obtained. It is thus possible to obtain an increased wiring density as well as high performance and high reliability in a semiconductor device.

The fourth embodiment of the invention will now be described.

Like the second embodiment described before, a semiconductor layer is selectively etched to a desired depth using a mask pattern, thus forming first grooves having large and small widths. Then a thermal treatment is carried out using an oxidation-resistive mask pattern to form a first insulating film in the first grooves. Alternatively, the mask pattern may be removed, and then an insulating film may be deposited to a thickness sufficient to fill the first grooves.

A mask pattern in the form of strips is then formed on the principal surface of a portion of the insulating film in at least the large width groove. Examples of the mask material are a resist, SiO$_2$ and Si$_3$N$_4$. The first insulating film is then selectively etched by means of anisotropic etching such as reactive ion etching or by means of liquid etching with th mask pattern used as a mask, thus forming second grooves. This selective etching may be carried out to etch the entire thickness of the insulating film or to leave a thin bottom layer of the first insulating film. In the former case, prior to a process of filling the second grooves with a conductive material to be described later, a thermal treatment is carried out to form an oxide film in a superficial portion of the semiconductor layer constituting the bottom of the second grooves.

The second grooves are then filled with a conductive material. This is accomplished by depositing the conductive material on the entire wafer surface to a thickness sufficiently greater than one half the width of the second grooves and then etching the deposited conductive film until the surface of the remaining conductive film is flush with the semiconductor layer. The conductive material may be any one of those mentioned before in connection with the third embodiment.

With the conductive film left in the second grooves formed in the insulating film, an isolating layer, which includes a conductive film pattern in the form of stripes (which can serve as interconnection electrodes) surrounded by the insulating film pattern, and having a large width can be obtained. A semiconductor device such as a bipolar element or a MOS element may be formed in the island portion of the semiconductor layer isolated by the large width isolating layer, and the small width isolating layer if necessary.

According to the fourth embodiment, like the third embodiment, it is possible to obtain an increased wiring density as well as high performance and high reliability in a semiconductor device.

In the above first to fourth embodiment, the second grooves may be formed by means of isotropic etching such as liquid etching using an etchant such as ammonium fluoride as well as by anisotropic etching such as reactive ion etching. In the former case, after depositing an insulating material or a conductive material on the entire wafer surface inclusive of the surfaces of the first grooves, a resist pattern may be formed on the insulating film or conductive film to cover the entirety of the large width first groove, and then the isotropic etching may be carried out. By so doing, not only the portion of the insulating film or the conductive film on the semiconductor layer other than the groove, but also portions of the film on the side surfaces of the grooves, can be etched so that small width second grooves can be formed.

Various examples of the invention applied to the manufacture of bipolar type transistors will now be described with reference to the drawings.

EXAMPLE 1

Figure 6A:
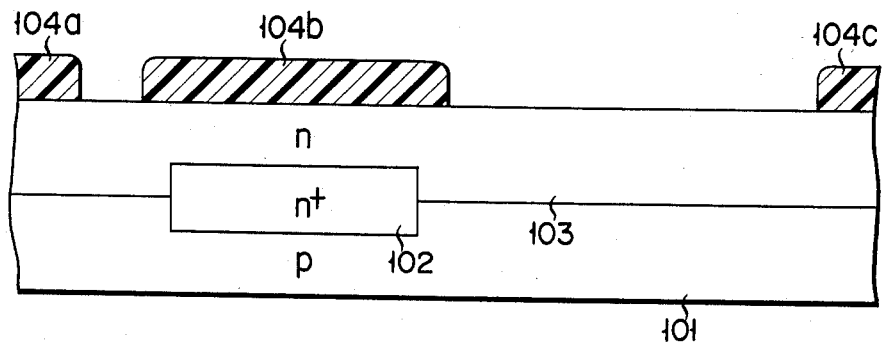
FIGS. 6A to 6G are sectional views illustrating the steps of manufacture of a semiconductor device in Example 1 according to the invention.
Figure 6B:
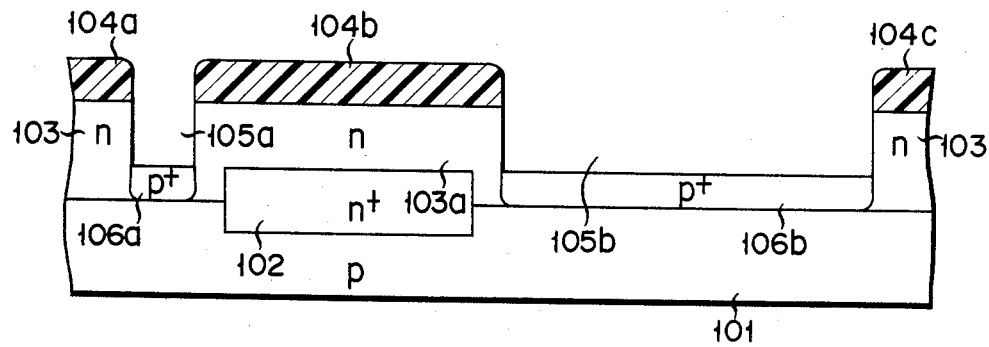

As shown in FIG. 6A, in a p-type semiconductor substrate 101 a high-impurity concentration buried layer 102 doped with an n-type impurity was formed. Atop this system, an n-type semiconductor layer 103 was epitaxially grown to a thickness of approximately 2 μm. A resist pattern 104a to 104c was then formed by photoetching techniques on the surface of the semiconductor layer 103 other than portions thereof in which grooves were to be formed. The semiconductor layer 103 was then selectively etched in an anisotropic reactive ion etching process with the resist pattern 104a to 104c used as mask, as shown in FIG. 6B. Thus, a groove 105a having a small width of 1 μm and a groove 105b having a large width of 6 μm, having depths of 1 μm, were formed. These grooves 105a and 105b had substantially perpendicular side walls. Subsequently, boron, an impurity of the same conductivity type as the substrate 101, was then ion implanted with the resist patterns 104a to 104c again used as a mask. The system was then thermally treated to form p+-type regions 106a and 106b as channel cut-out regions constituting the bottom of the grooves 105a and 105b and contiguous to the substrate 101. An island region 103a of semiconductor layer 103a, in which an npn transistor was to be formed, was thus defined as an isolated region by the grooves 105a and 105b and p+-type regions 106a and 106b.

Figure 6C:
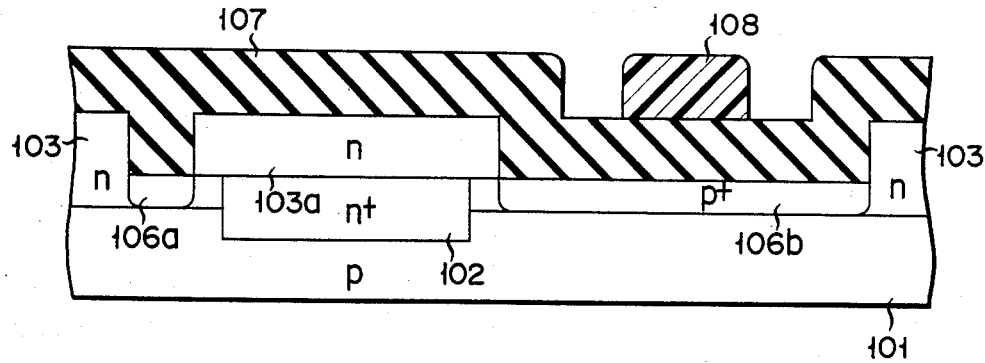

Then SiO$_2$ was deposited by the CVD process on the entire surface of the semiconductor layer 103 to a thickness of approximately 1 μm which is equal to the depth of the grooves 105a to 105b. During this process, SiO$_2$ was gradually deposited on the surfaces of the grooves 105a and 105b. As a result, a SiO$_2$ film was formed which had a flat surface as well as completely filling the grooves 105a and 105b as shown in FIG. 6C. During the deposition process, substantially no expansion of the p+-type regions 106a and 106b occurred unlike when forming an oxide film in a process of thermal oxidation, which has to be carried out at a high temperature and for a long time. A resist pattern 108 was then formed by photoetching techniques on a portion of the SiO$_2$ film in the groove 105b having a large width.

Figure 6D:
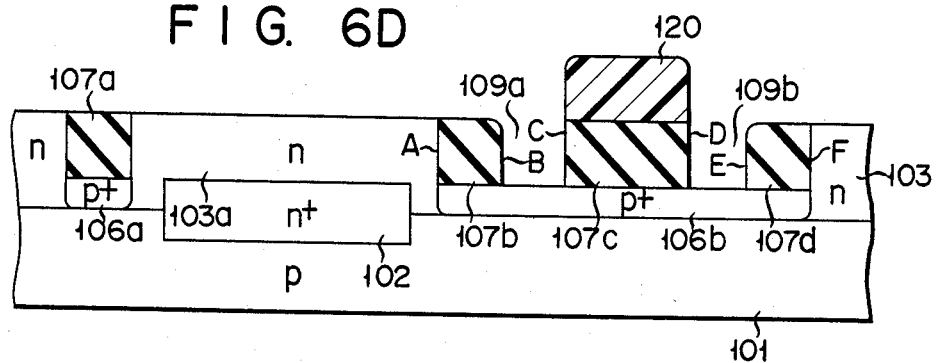
Figure 6E:
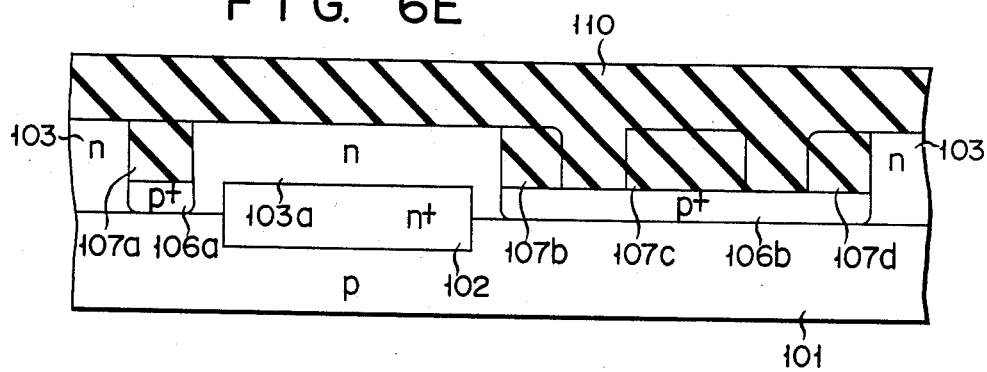

The SiO$_2$ film 107 was then selectively etched by an anisotropic reactive ion etching process with the resist pattern 108 used as a mask until the semiconductor layer 103 was exposed as shown in FIG. 6D. This process was carried out to leave a portion 107a of SiO$_2$ as such in the groove 105a having a small width. Also, portions 107b and 107d of SiO$_2$ in the large width groove 105b that were contiguous to the side walls A and F of the groove 105b were left as such. Further, a portion 107c of SiO$_2$ under the resist pattern 107d was left as such. The portion 107d was spaced apart at certain distances from the portions 107b and 107d. The portion 107c of SiO$_2$ is preferably spaced apart at a distance greater than the thickness of the SiO$_2$ film from the side surfaces A and F of the large diameter groove 105b. This is because SiO$_2$ film portions in the neighborhood of the side surfaces A and F of the groove 105b are shaped like a stair-case. In this example, the SiO$_2$ film was etched by the reactive ion etching process until the semiconductor layer 103 was exposed. Thus, a gap 199a was formed between opposed side surfaces B and C of the remaining portions 107a and 107 of the SiO$_2$ film. Also, a gap 109b was formed between opposed side surfaces D and F of the remaining portions 107c and 107d of the SiO$_2$ film. The magnitude of the gaps 109a and 109b depends upon the precision of alignment of the resist pattern 108 and can be held to within 1 to 2 μm.

Figure 6F:
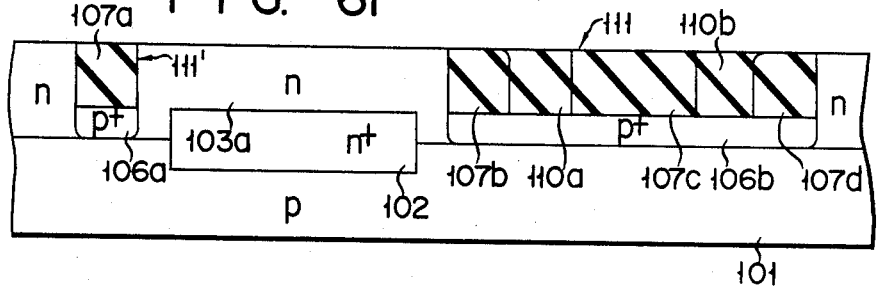
Figure 6G:
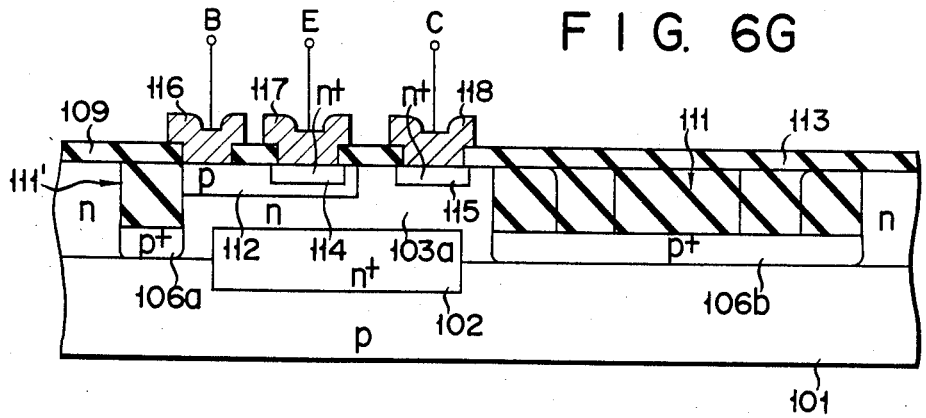

The resist pattern 108 was then removed. Then a second SiO$_2$ film 110 was deposited by the CVD process to a thickness greater than one half the width of either one of the gaps 109a and 109b having a greater width, as shown in FIG. 6B. The SiO$_2$ film 110 was then etched using ammonium fluoride until the semiconductor layer 103 was exposed as shown in FIG. 6F. This process was carried out to leave portions of SiO$_2$ as such in the gaps 109a and 109b. Thus, an isolating layer 111 having a large width (of 6 μm) was formed which consisted of the portions 110a and 110b of the second SiO$_2$ film and the portions 107b, 107c and 107d of the first SiO$_2$ film. A portion 107a of the first SiO$_2$ film left in the small width groove 107a could be utilized as an isolating layer 111' as well.

In the island region 103a of semiconductor layer, isolated by the small and large width isolating layers 111' and 111, a p-type base region 112 was formed by ion implanting boron by the resist block process. Then, a SiO$_2$ layer serving as an insulating film was deposited on the entire wafer surface by the CVD process to a thickness of approximately 3,000 Å. The SiO$_2$ film 113 was then selectively photoetched to form windows for an emitter and a collector. Arsenic was then ion implanted through these windows to form an n+-type emitter region 114 in the p-type base region 112 and an n+-type collector region 115 in the semiconductor region 103a. A further window was then formed in the SiO$_2$ film 113 over a portion thereof corresponding to the p-type base region 112. A conductor film, for instance an aluminum film, was then deposited by vaccum deposition on the entire wafer surface and patterned by photoetching etchniques to form aluminum electrodes 116 to 118 for the base, emitter and collector as shown in FIG. 6I. Thus, an npn bipolar transistor was obtained.

In the above example, the isolating layers 111' and 111 with a small width and a large width respectively can be obtained. In addition, the surface of the n-type semiconductor region 103a, in which an npn transistor is to be formed, and the surface of the large width isolating layer 111 can be made flush with each other as shown in FIG. 6F. Thus, it is possible to eliminate the possibility for an electrode lead that leads from the isolated npn transistor region to the large width isolating region from being broken at the boundary between two regions, which can be the case if there is a difference in level between the two regions. Further, it is possible to eliminate current leaks among individual npn transistors formed in an IC or LSI. It is thus possible to readily obtain an npn bipolar transistor IC which has high performance and high integration density.

EXAMPLE 2

Figure 7A:
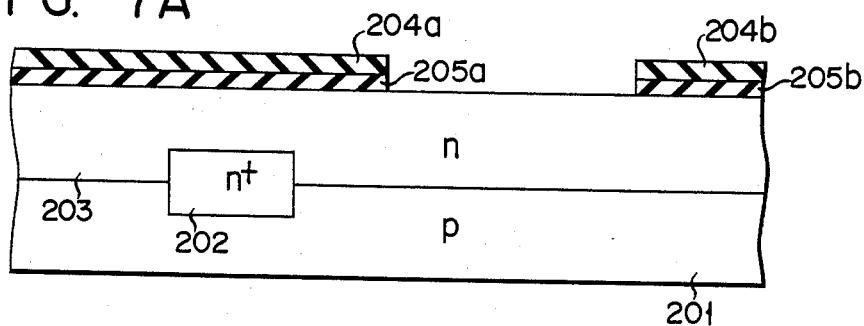
FIGS. 7A to 7G are sectional views illustrating the steps of manufacture of a semiconductor device in Example 2 according to the invention.
Figure 7B:
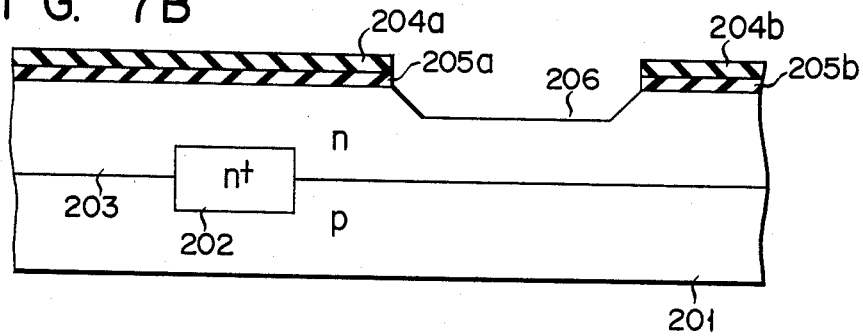
Figure 7C:
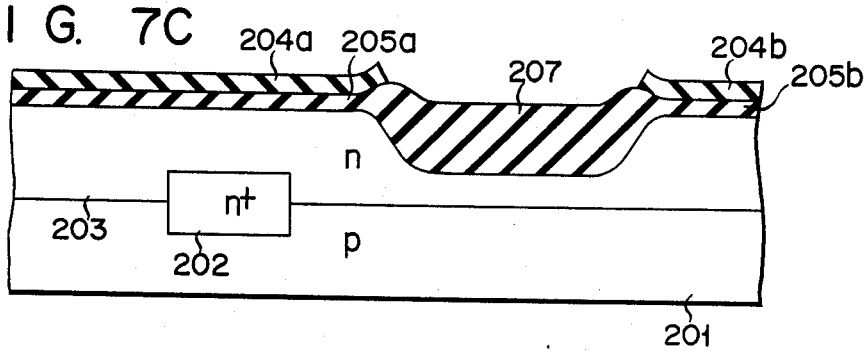

As shown in FIG. 7A, in a p-type semiconductor substrate 201 a high-impurity concentration buried layer 202 doped with an n-type impurity was formed. Atop this system, an n-type semiconductor layer 203 was epitaxially grown to a thickness of approximately 2 μm. A thin thermal oxide film and a thin silicon nitride film were then successively formed on the surface of the semiconductor layer 203. A portion of the lamination of the silicon nitride film and thermal oxide film corresponding to a large width groove to be formed was then photoetched to form a silicon nitride film pattern 204a, 204b and thermal oxide film pattern 205a, 205b.

The semiconductor layer 206 was then selectively etched to a desired depth with the silicon nitride film pattern 204a used as a mask, thus forming a first groove 206 having a large width as shown in FIG. 6B. Then, a thermal oxidation treatment was carried out using the silicon nitride film pattern 104a, 104b as an oxidation-resisting mask. In this process, an oxide film 207 was selectively formed as a first isolating layer in the groove 206.

Figure 7D:
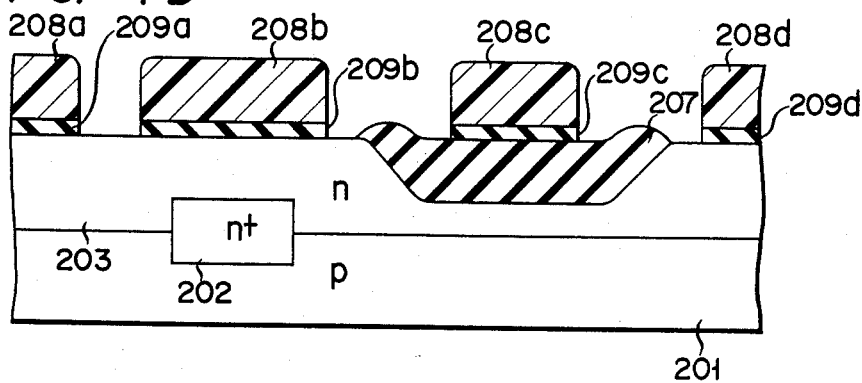
Figure 7E:
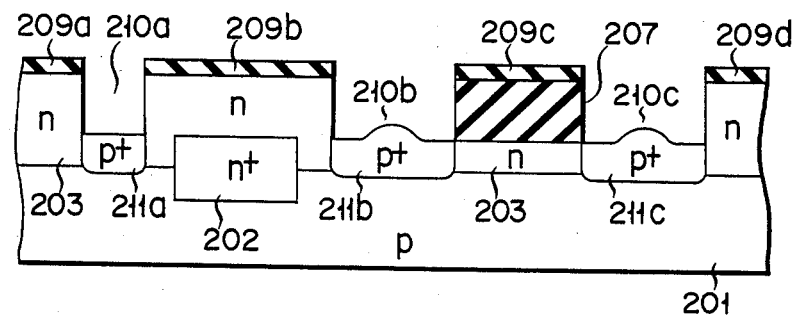

The silicon nitride film pattern 204a, 204b and thermal oxide film pattern 205a, 20bb were then successively removed. A thin silicon nitride film was then deposited again over the entire surface. On this silicon nitride film, a resist pattern 208a to 208d was formed by a photoetching process. With this resist pattern 208a to 208d as a mask, the silicon nitride film was patterned to obtain a silicon nitride film pattern 209a to 209d as shown in FIG. 7D. Then, with the resist pattern 208a to 208d as a mask the exposed portions of semiconductor layer 203 and oxide film 207 were etched by reactive ion etching, thus forming a second groove 210a having a small width in the semiconductor layer 203 and second grooves 210b and 210c having a large width in regions including opposite edge portions of the oxide film 207. In this process, the portion 207' of oxide film in the first groove 206 was left. Subsequently, with the resist pattern 208a to 208d as a mask, a p-type impurity, for instance boron, was ion implanted. The resist pattern 208a to 208d was then removed, and the system was then thermally treated to form p+-type regions 211a to 211c, which constituted the bottom of the grooves 210a to 210c and were contiguous to the p-type semiconductor substrate 201 as shown in FIG. 7E.

Figure 7F:
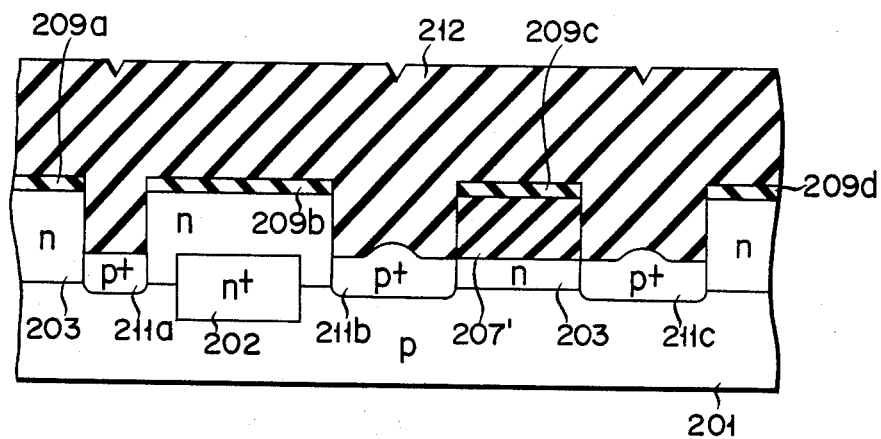
Figure 7G:
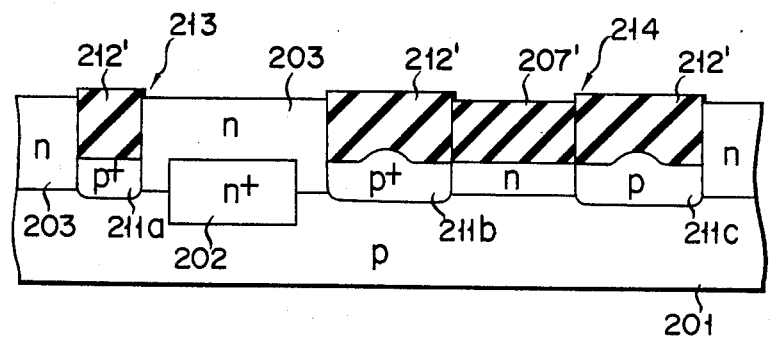

A SiO₂ film 212 was then deposited by the CVD process on the entire wafer surface to a thickness sufficiently greater than one half the width of the second grooves 210a to 210c. The SiO₂ film 212 thus formed has a substantially flat surface as shown in FIG. 7F. The SiO₂ film 212 was then etched using ammonium fluoride until the silicon nitride film 209a to 209d on the semiconductor layer 203 was exposed. In this process, a portion 212' of SiO₂ was left in the second groove 210a. This SiO₂ portion 212' could be utilized as a small width isolating layer 213. Also in this process portions 212' of SiO₂ were left in the second grooves 210b and 210c between the remaining oxide film 207' and the opposite side surfaces of the groove 206. These SiO₂ portions 212' and the remaining oxide film 207' integral therewith constituted an isolating layer 214 having a large width, as shown in FIG. 7G. The silicon nitride film pattern 209a to 209d was then removed. Thereafter, an npn transistor (not shown) was formed in the usual manner in the island portion of the semiconductor layer isolated by the small and large width isolating layers 213 and 214.

In this example again, the isolating layers 213 and 214 having a small width and a large width respectively can be obtained. In addition, the difference in level between the surface of the n-type semiconductor layer 203 in the isolated region where the npn transistor is formed, and the surface of the large width isolating region 214 can be reduced to improve the flatness of the surface. Thus, it is possible to reduce or eliminate the possibility for an electrode lead that leads from the isolated npn transistor region to the large width isolating region from being broken at the boundary between the two regions. Further, it is possible to eliminate current leaks among individual npn transistors formed in an IC or LSI with the p+-type regions 211a to 211c formed under the isolating layers 213 and 214. It is thus possible to readily obtain a bipolar LSI which has high performance and high integration density.

EXAMPLE 3

Figure 8A:
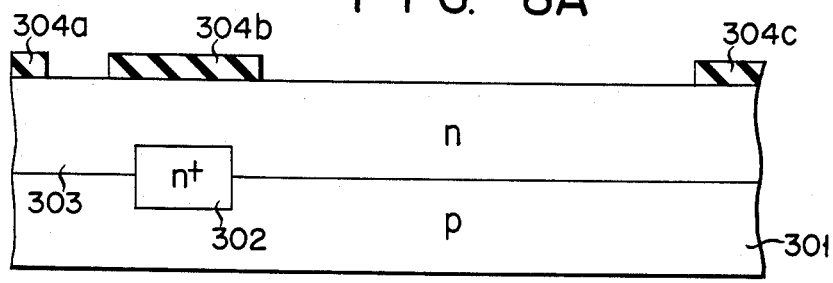
FIGS. 8A to 8G are sectional views illustrating the steps of manufacture of a semiconductor device in Example 3 according to the invention.

As shown in FIG. 8A, in a p-type semiconductor substrate 301 a high-impurity concentration buried layer 302 doped with an n-type impurity was formed. Atop this system an n-type semiconductor layer 302 was epitaxially grown to a thickness of approximately 2 μm. A thin silicon nitride film was then deposited on the surface of the semiconductor layer 303. Portions of the deposited silicon nitride film corresponding to grooves having small and large widths to be formed where then selectively photoetched to form a silicon nitride film pattern 304a to 304d.

Figure 8B:
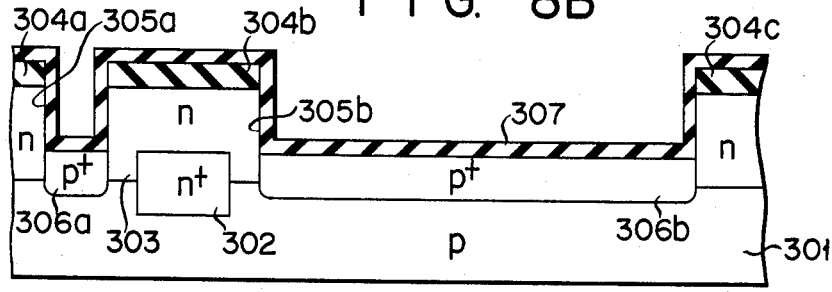
Figure 8C:
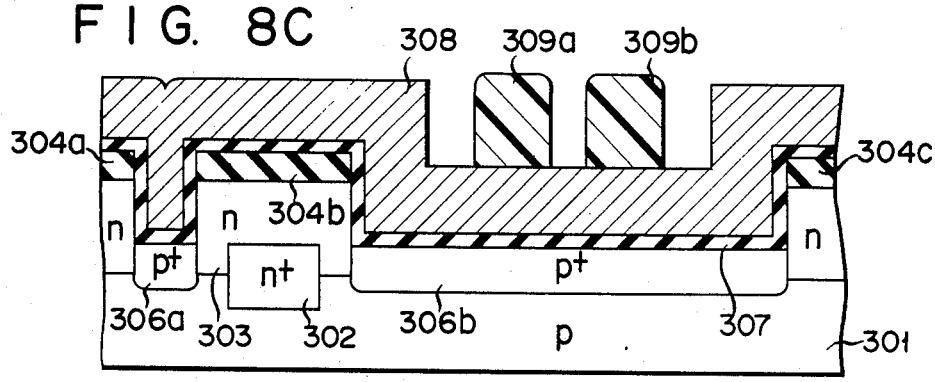

With the silicon nitride film pattern 304a to 304c as a mask the semiconductor layer 303 was selectively etched to a desired depth by reactive ion etching. Thus, a first groove 305a having a small width and a first groove 305b having a large width were formed as shown in FIG. 8B. Subsequently, boron was ion implanted with the patterns 304a to 304c used again as a mask and activated to form p+-type regions 306a and 306b in portions of the semiconductor constituting the bottom of the grooves 305a and 305b. A first SiO₂ film 307 was then deposited by the CVD process on the entire wafer surface inclusive of the surfaces of the grooves 305a and 30bb to a thickness sufficiently less than the depth of the grooves 305a and 305b.

Figure 8D:
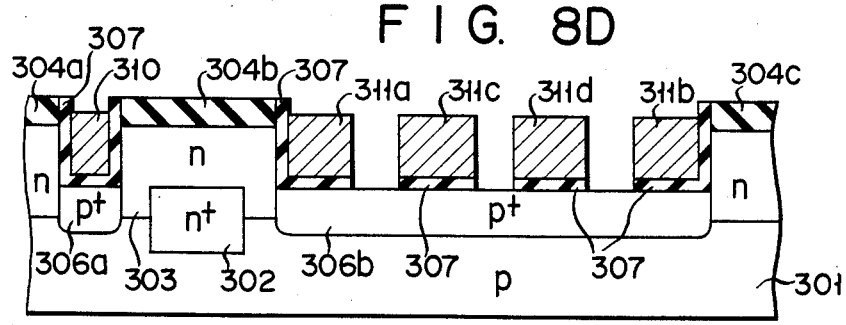

A phosphorus-doped polycrystalline silicon film 308 was then deposited on the entire surface to a thickness substantially equal to the depth of the groove 305b, as shown in FIG. 6C. A resist pattern in the form of stripes 309a and 309b was then formed by a photoetching process on the principal surface of a portion of the polycrystalline silicon film 308 in the large width groove 305b. With this resist pattern as a mask the polycrystalline silicon film 308 was then anisotropically etched by means of reactive ion etching. In this process, a portion 310 of the polycrystalline silicon was left in the space defined by the portion of the SiO₂ film 307 covering the small width groove 305a as shown in FIG. 8D. Also, portions 311a and 311b of polycrystalline silicon were left on portions 309a and 309b of the resist pattern in the large width groove 305b. Further, portions 311c and 311d of polycrystalline silicon were left on portions 309a and 309b of the resist pattern in the groove 305b. If this etching process is carried out by means of liquid etching, only the portions 311a and 311b of polycrystalline silicon on the corresponding portions 309a and 309b of the resist pattern would be left.

Figure 8E:
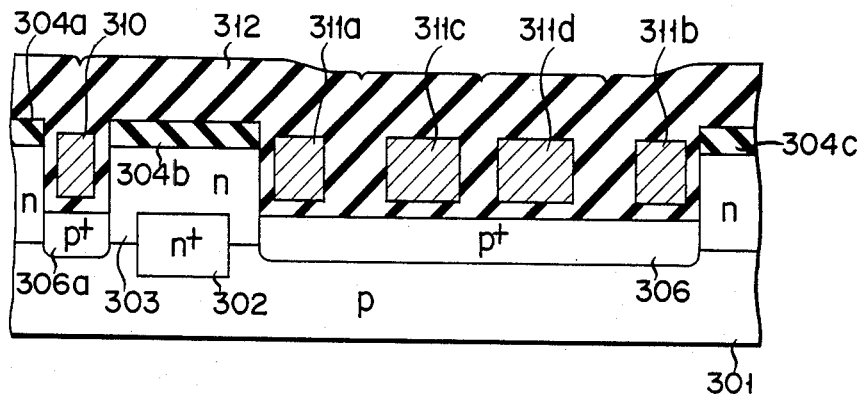
Figure 8F:
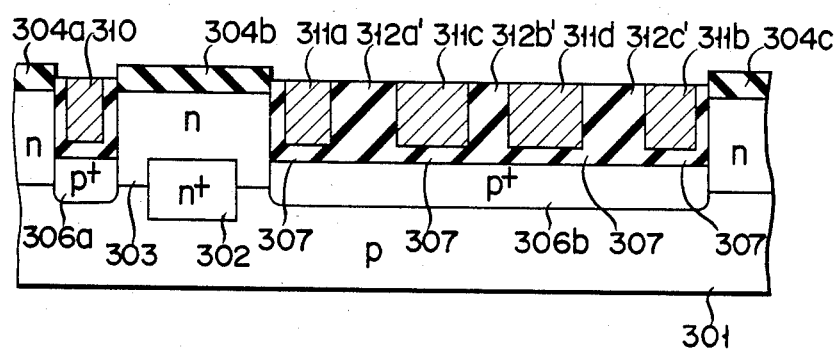
Figure 8G:
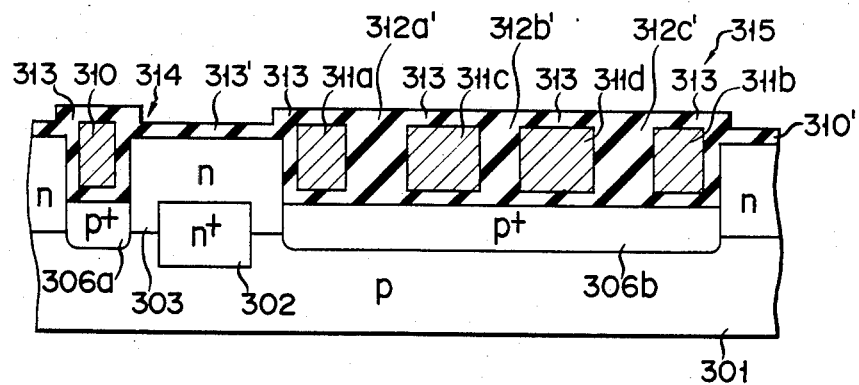

Afterwards, a second SiO₂ film 312 was deposited by the CVD process to a thickness sufficiently greater than one half the width of the second grooves defined by the polycrystalline silicon pattern portions 311a to 311d as shown in FIG. 8E. The SiO₂ film 312 was then etched using ammonium fluoride until the surfaces of the silicon nitride film pattern 304a to 304c was exposed. In this process, portions 312'a to 312'c of the SiO₂ film 312 were left in the second grooves defined by the polycrstalline silicon pattern portions 311a to 311d remaining in the large width groove 305b, as shown in FIG. 8F. The silicon nitride film pattern 304a to 304c was then removed, and a thermal treatment on the resultant system was carried out. As a result, an oxide film 313 ws grown as shown in FIG. 8G. Thus, an isolating layer 314 having a small width was formed in the small width groove 305a. The isolating layer 314 included the remaining portion 310 of polycrystalline silicon (which could serve as a lead) in this groove surrounded by the relevant portions of the first Si₂O film 307 and oxide film 313 as shown in FIG. 8G. Also, an isolating layer 315 having a large width was formed in the large width groove 315. The isolating layer 315 included the remaining portions 310 of polycrystalline silicon (which could serve as leads) in this groove surrounded by the relevant portion of the first SiO₂ film 307, second SiO₂ film pattern 312'a to 312'c and the relevant portion of the oxide film 313. Designated at 313' is an oxide film portion that was grown on the surface of the semiconductor layer 303. An npn transistor (not shown) was subsequently formed in the usual manner in the island portion of the semiconductor layer isolated by the small and large width isolating layers 314 and 315.

In this example, the phosphorus-doped polycrystalline silicon pattern 311a to 311d that can serve as interconnection electrodes buried in the large width isolating layer 315. It is thus possible to obtain a bipolar LSI which can have high density wiring as well as high performance and high reliability.

EXAMPLE 4

Figure 9A:
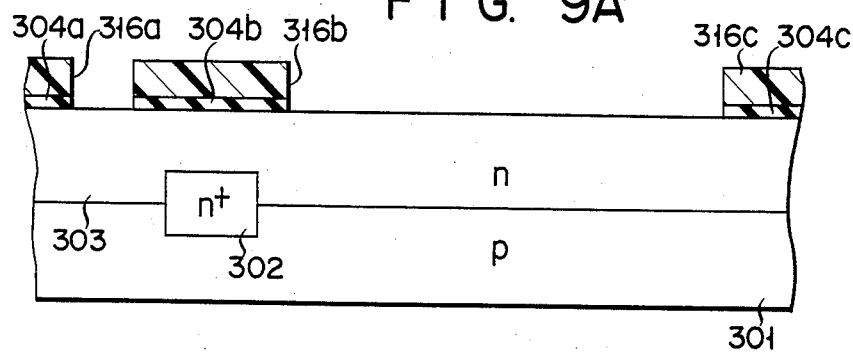
FIGS. 9A to 9G are sectional views illustrating the steps of manufacture of a semiconductor device in Example 4 according to the invention.
Figure 9B:
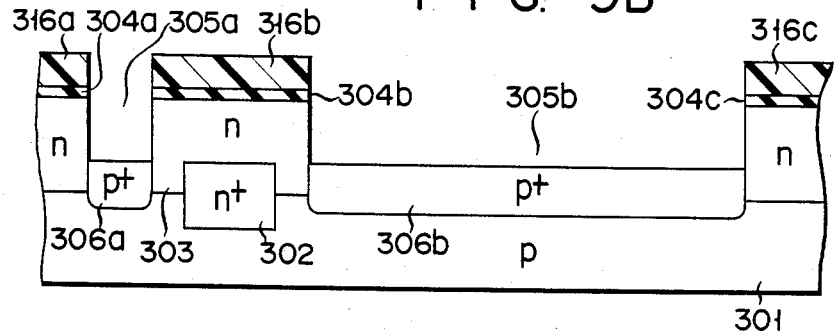

A silicon nitride film was deposited on the same semiconductor layr 303 as in Example 3 as shown in FIG. 9A. A resist pattern 316a 315c was then formed on portions of the surface of the silicon nitride film other than those corresponding to grooves having small and large widths to be formed by a photoetching process. The silicon nitride film was then selectively etched with the resist pattern 316a to 316c used as a mask, thus forming a silicon nitride film pattern 304a to 304c. The semiconductor layer 303 was then selectively etched to a desired depth by a reactive ion etching process using the resist pattern 316a to 316c again as a mask. Thus, first grooves 305a and 30bb having a small width and a large width were formed as shown in FIG. 9B. Boron was then ion implanted with the resist patterns 316a to 316c again used as a mask, and activated, thus forming p⁺-type regions 306a and 306a in portions of the semiconductor which constituted the bottom of the grooves 305a and 30bb and were contiguous to the p-type semiconductive substrate 301.

Figure 9C:
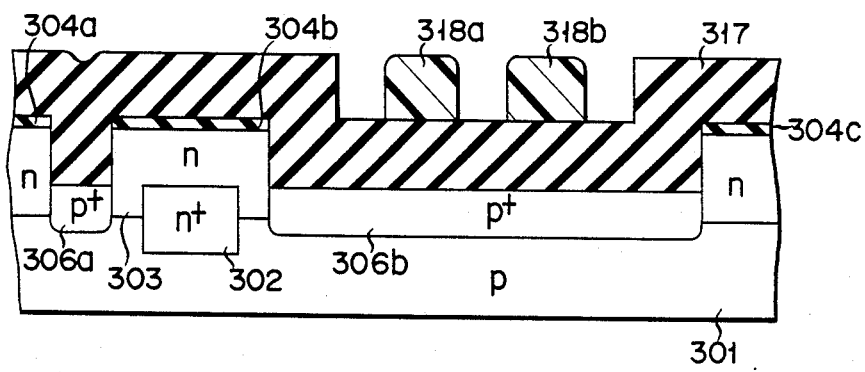
Figure 9D:
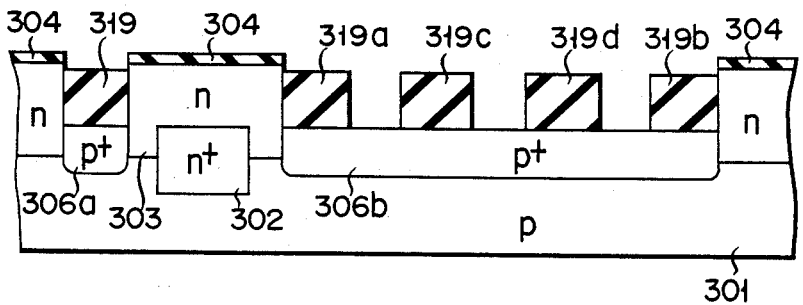

Then a SiO₂ film 317 was then deposited on the entire wafer surface to a thickness substantially equal to the depth of the large width groove 305b as shown in FIG. 9C. A resist pattern in the form of stripes 318a and 318b was then formed by a photoetching process on the principal surface of a portion of the SiO₂ film 317 in the large width groove 305b. The SiO₂ 317 was then etched by means of anisotropic etching such as reactive ion etching. In this process, a portion 319 of the SiO₂ film 317 was left in the small width groove 305a as shown in FIG. 9D. Alsom portions 319a and 319b of the SiO₂ film were left contiguous to the opposite side surfaces of the large width groove 305b. Further, portions 319c and 319d of the SiO₂ film were left under the resist pattern portions 318a and 318b in the groove 305b.

Figure 9E:
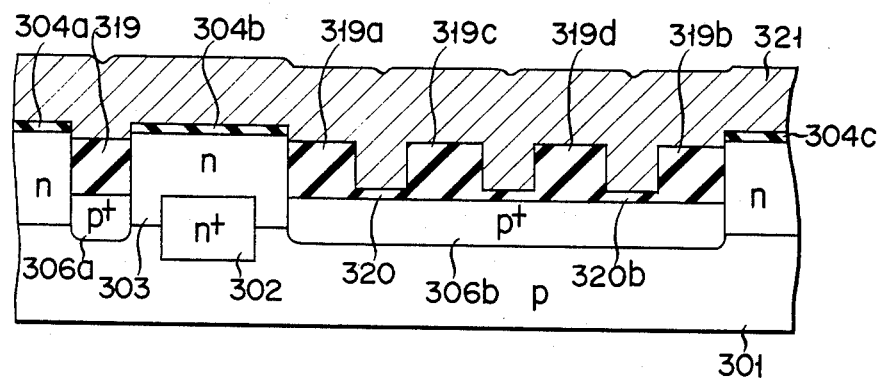
Figure 9F:
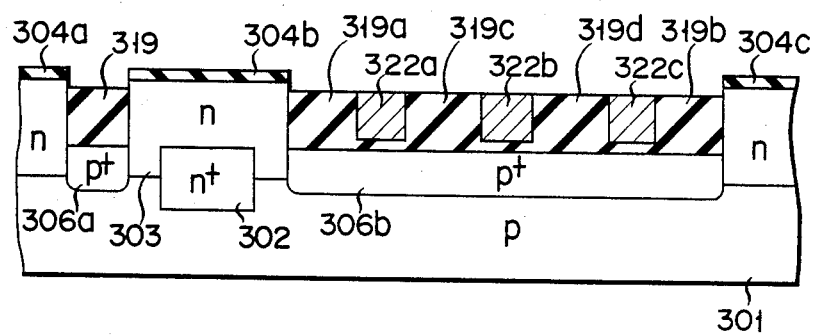

Then, an oxidation treatment was carried ou. In this process, a thin thermal oxide film 320 was formed on portions of the surface of the semiconductor layer 303 not covered by the SiO₂ film pattern 319a to 319d as shown in FIG. 9E. At this time, the oxidation of the surface of the semiconductor layer 303 other than the grooves was prevented by the oxidation-resisting silicon nitride film pattern 304a to 304c. A phosphorus-doped polycrystalline silicon film 321 was subsequently deposited to a thickness sufficiently greater than one half the width of the second grooves defined by the SiO₂ film pattern 319a to 319d. The polycrystalline silicon film 321 was then etched until the surface of the silicon nitride film pattern 304a to 304c was exposed. Thus, a polycrystalline silicon pattern 322a to 322c was left in the second grooves defined by the SiO₂ film pattern 319a to 319d in the large width groove 305b as shown in FIG. 9F. In the process of etching the polycrystalline film pattern 321, the silicon nitride film pattern 304a to 304c serves as a mask to prevent the etching of the semiconductor layer surface.

Figure 9G:
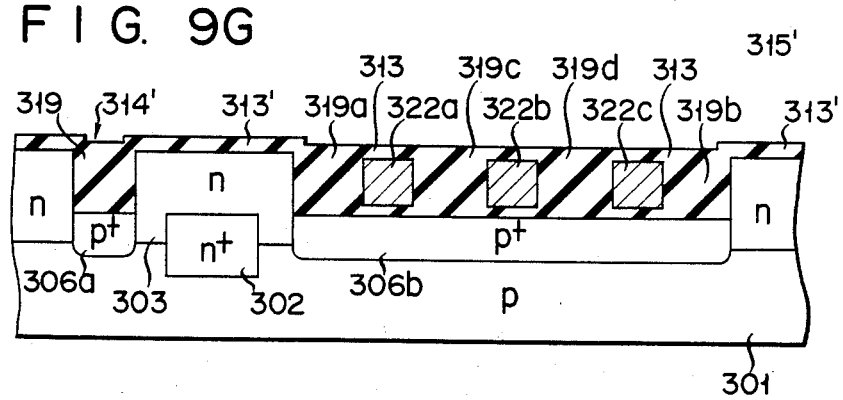

The silicon nitride film pattern 304a to 304c was then removed, and then a thermal treatment was carried out. As a result, as oxide film 313 was grown as shown in FIG. 9G. Thus, an isolating layer 313' having a large width was formed in the large width groove 305b. The isolating layer 315' included the remaining portions 322a to 322c of the phosphorus-doped polycrystalline silicon layer (which could serve as leads) in this groove surrounded by the relevant portion of the thermal oxide film 320, SiO₂ film pattern 319a to 319d and the relevant portion of the oxide film 313. The portion 319 of SiO₂ that was left in the small width groove 305a could serve as an isolating layer 314' having a small width. An npn transistor (not shown) was subsequently formed in the usual manner in the island portion of the semiconductor layer isolated by the small and large width isolating layers 314' and 315' to obtain a bipolar LSI.

In this example, the phosphorus-doped polycrystalline silicon pattern 322a to 322c that can serve as leads in buried in the large width isolating layer 315'. It is thus possible to obtain a bipolar LSI which can have high wiring density as well as high performance and high reliability.

EXAMPLE 5

This example is a modification of the process of forming the second grooves.

Figure 10A:
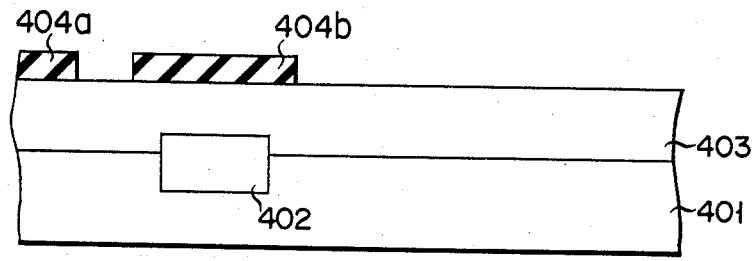
FIGS. 10A to 10C are sectional views illustrating the steps of manufacture of a semiconductor device in Example 5 according to the invention.
Figure 10B:
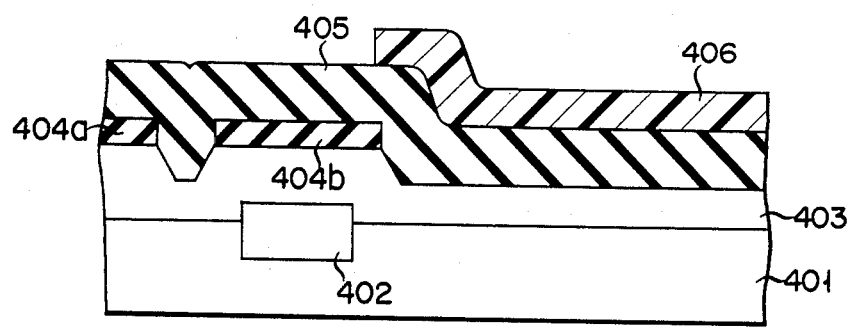

As shown in FIG. 10A, in a p-type silicon substrate 401 an n-type buried layer 402 was selectively formed. Atop the system, an n-type semiconductor layr 403 was then formed. A mask pattern 404a, 404b of a silicon nitride film or the like was then formed on the semiconductor layer 403.

Figure 10C:
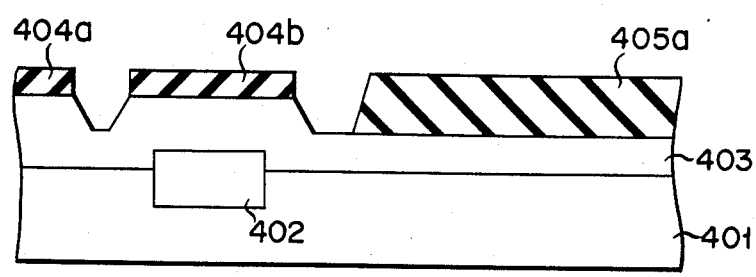

The semiconductor layer 403 was then etched using the mask pattern 404a, 404b and also using an anisotropic etchant composed of KOH to form a groove having tapered side surfaces as shown in FIG. 10C. A SiO₂ film 405 was then deposited as a first insulating film by the CVD process over the entire wafer surface to a thickness substantially equal to the depth of the groove. The SiO₂ film 405 was then photoetched to form a resist pattern 406 over the groove.

Then, using the resist pattern 406 the SiO₂ film 405 was selectively etched with a liquid etchant such as ammonium fluoride to leave a SiO₂ pattern 405a which was part of an eventual isolating layer. The second grooves were defined by this SiO₂ pattern 405a.

Subsequently, the same processes as in Example 1 were carried out to obtain isolating layers having small and large widths.

According to the invention, by this method of manufacturing semiconductor device, the semiconductor layer may be a p-type epitaxial layer formed on a p-type semiconductor substrate, a lamination of two n-type epitaxial layers formed on a p-type semiconductor substrate or a lamination of a p-type epitaxial layer and an n-type epitaxial layer formed on a p-type semiconductor substrate.

According to the invention, by this method of manufacturing semiconductor device it is possible to form an npn bipolar transistor on a p-type semiconductor substrate by a triple diffusion process as well as to form an npn bipolar transistor on an n-type semiconductor layer on a p-type semiconductor substrate as in the above embodiments.

According to the invention, by the method of manufacturing semiconductor device it is possible to manufacture a bipolar semiconductor device such as I$^2$L or a MOS semiconductor device as well as an npn bipolar transistor.

As has been described in the foregoing, according to the invention self-aligned isolating layers having desired small and large widths may be formed in grooves formed mostly in a semiconductor layer. Thus, it is possible to manufacture a semiconductor device such as a bipolar transistor, which has high integration density, high reliability and high performance, and also to provide a method of manufacturing a semiconductor device, with which an isolating layer having excellent flatness with respect to an isolated element region and including a buried conductor serving as leads, can be obtained.

What we claim is:

1. A method of manufacturing a semiconductor device comprising the steps of:

forming a first groove having a large width in a semiconductor layer;
    filling said first groove with a first insulating film;
    forming at least one second groove in said first insulating film in said first groove, said second groove being defined by an insulating material; and
    filling said second groove with a conductive film to form an isolating layer having a large width including said conductive film surrounded by said insulating material.

2. The method according to claim 1, wherein said step of filling said second groove with said conductive film includes depositing a conductive material on the entire surface and to a thickness no less than one half the width of said second grooves and subsequently etching said conductive material until said semiconductor layer is exposed.

3. The method according to claim 1, wherein said first insulating film and second insulating film are made of a material selected from a group consisting of SiO$_2$, Si$_3$N$_4$ and Al$_2$O$_3$.

4. The method according to claim 1, wherein said conductive film is made of a material selected from a group consisting of impurity-doped polycrystalline silicon impurity-doped amorphous silicon, tungsten silicide, molybdenum silicide, aluminum, molybdenum, titanium and tantalum.

5. The method according to claim 1, further comprising a step of selectively doping a portion of the semiconductor layer constituting the bottom of the first or second groove with impurities, thus forming a channel stopper region.

* * * * *